US011758666B2

(12) United States Patent
Chou et al.

(10) Patent No.: US 11,758,666 B2
(45) Date of Patent: *Sep. 12, 2023

(54) MANUFACTURING METHOD OF METAL STRUCTURE

(71) Applicant: InnoLux Corporation, Miao-Li County (TW)

(72) Inventors: Hsueh-Hsuan Chou, Miao-Li County (TW); Yi-Hung Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 53 days.

This patent is subject to a terminal disclaimer.

(21) Appl. No.: 17/486,935

(22) Filed: Sep. 28, 2021

(65) Prior Publication Data

US 2022/0087028 A1   Mar. 17, 2022

Related U.S. Application Data

(63) Continuation-in-part of application No. 16/953,338, filed on Nov. 20, 2020.

(30) Foreign Application Priority Data

Sep. 14, 2020  (CN) .......................... 202010961983.0
Sep. 13, 2021  (CN) .......................... 202111068603.1

(51) Int. Cl.
*H05K 3/00*   (2006.01)
*H05K 3/06*   (2006.01)
*H01L 21/48*  (2006.01)

(52) U.S. Cl.
CPC ......... *H05K 3/007* (2013.01); *H01L 21/4846* (2013.01); *H05K 3/064* (2013.01)

(58) Field of Classification Search
CPC ........ H05K 3/007; H05K 3/027; H05K 3/064; H01L 21/4846
See application file for complete search history.

(56) References Cited

U.S. PATENT DOCUMENTS 9,719,184 B2 *  8/2017  Xu ........................... C25D 5/48
2006/0134819 A1 *  6/2006  Tang .................. B81C 1/00666
438/725

(Continued)

FOREIGN PATENT DOCUMENTS

EP    2075825 A1 *  7/2009  ........ H01L 21/32115

*Primary Examiner* — Jeffrey T Carley
(74) *Attorney, Agent, or Firm* — Winston Hsu

(57) ABSTRACT

A manufacturing method of a metal structure is disclosed, which includes the following steps: forming a seed layer on a substrate; forming a patterned metal layer on the seed layer, wherein the patterned metal layer includes a metal member; forming a first patterned photoresist layer on the seed layer, wherein a thickness of the first patterned photoresist layer is less than a thickness of the patterned metal layer; and performing a first patterning process to the seed layer through the first patterned photoresist layer to form a patterned seed layer, wherein after the first patterning process, the metal member includes a first part and a second part, the first part is disposed between the patterned seed layer and the second part, and a width of the first part is greater than a width of the second part.

19 Claims, 15 Drawing Sheets

(56) References Cited

U.S. PATENT DOCUMENTS

| | | | |
|---|---|---|---|
| 2008/0200022 A1* | 8/2008 | Callahan | H01L 23/481 257/E21.597 |
| 2009/0136657 A1* | 5/2009 | Slafer | C25D 5/022 427/124 |
| 2015/0068299 A1* | 3/2015 | Zhu | G01F 1/692 29/846 |
| 2019/0080995 A1* | 3/2019 | Lee | H01L 23/49822 |
| 2019/0096817 A1* | 3/2019 | Yu | H01L 23/3128 |
| 2020/0098678 A1* | 3/2020 | Tajima | H01L 23/49827 |
| 2020/0395323 A1* | 12/2020 | Lu | H01L 24/11 |

* cited by examiner

MANUFACTURING METHOD OF METAL STRUCTURE

CROSS REFERENCE TO RELATED APPLICATIONS

This application is a continuation-in-part of application Ser. No. 16/953,338, filed on Nov. 20, 2020. This application hereby incorporates entirely by reference the U.S. applications enumerated herein.

BACKGROUND OF THE DISCLOSURE

1. Field of the Disclosure

The present disclosure relates to a manufacturing method of a metal structure, and more particularly to a method for manufacturing a metal structure by using a seed layer.

2. Description of the Prior Art

Electronic devices are widely used in daily life and have become an indispensable necessity in modern society. A great amount of circuits are included in the electronic devices, and these circuits are usually made of metal materials. Generally, patterning processes such as exposure, development, and etching processes are used for defining patterns of the circuits. However, these processes require long processing time and plenty of materials, thus the overall manufacturing cost is higher and the efficiency is low. Therefore, the industry is still committed to shortening the process time and reducing the amount of materials to reduce the manufacturing cost and improve the efficiency.

SUMMARY OF THE DISCLOSURE

An embodiment of the present disclosure provides a manufacturing method of a metal structure including following steps: forming a seed layer on a substrate; forming a patterned metal layer on the seed layer, wherein the patterned metal layer includes a metal member; forming a first patterned photoresist layer on the seed layer, wherein a thickness of the first patterned photoresist layer is less than a thickness of the patterned metal layer; and performing a first patterning process to the seed layer through the first patterned photoresist layer to form a patterned seed layer, wherein after the first patterning process, the metal member includes a first part and a second part, the first part is disposed between the patterned seed layer and the second part, and a width of the first part is greater than a width of the second part.

These and other objectives of the present disclosure will no doubt become obvious to those of ordinary skill in the art after reading the following detailed description of the embodiment that is illustrated in the various figures and drawings.

DETAILED DESCRIPTION

Figure 1:
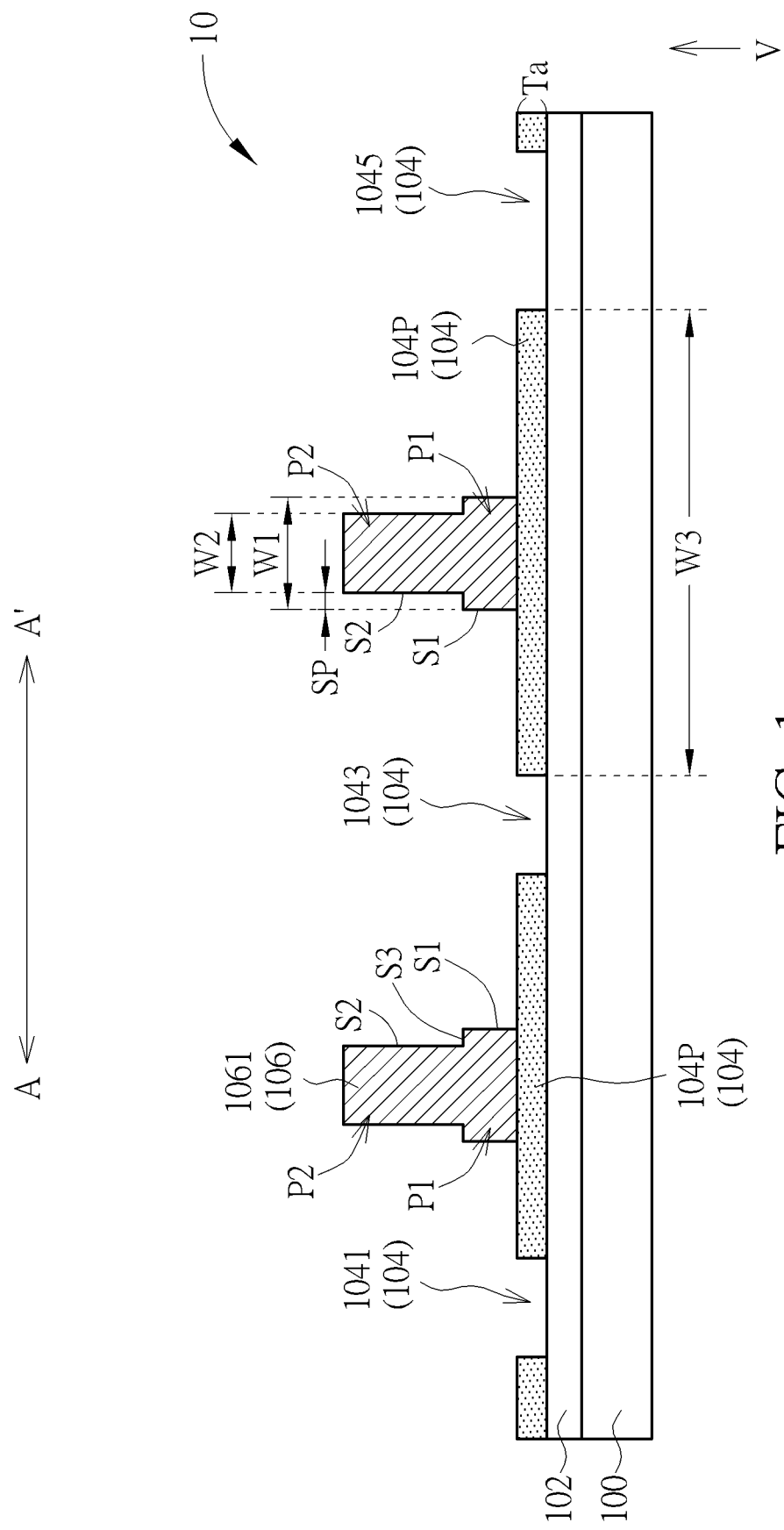
FIG. 1 is a cross-sectional view schematic diagram of a metal structure of an embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain elements in various drawings may not be drawn to scale. In addition, the number and dimension of each element shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

It should be understood that when an element or layer is referred to as being "on", "disposed on" or "connected to" another element or layer, it may be directly on or directly connected to the other element or layer, or intervening elements or layers may be presented (indirect condition). In contrast, when an element is referred to as being "directly on", "directly disposed on" or "directly connected to" another element or layer, there are no intervening elements or layers presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

In the present disclosure, the length, the thickness and the width may be measured by the optical microscope, and the thickness may be measured by the cross-sectional image in the electron microscope, but not limited herein. In addition, any two values or directions used for comparison may have certain errors.

The terms "about", "equal to", "identical to", "the same as", "practically" or "substantially" mentioned in this document generally mean being within 15% of a given value or range, or being within 5%, 3%, 2%, 1% or 0.5% of a given value or range. In addition, the terms "the given range is a first value to a second value" and "the given range being within the range of the first value to the second value" mean that the given range includes the first value, the second value and other values between them.

It should be noted that the technical features in different embodiments described in the following can be replaced, recombined, or mixed with one another to constitute another embodiment without departing from the spirit of the present disclosure.

The manufacturing method of the metal structure of the present disclosure may be used for forming conductive lines, circuits or other metal elements in the electronic devices, but not limited herein. In some embodiments, the manufacturing method of the metal structure of the present disclosure may also be used for forming marks such as alignment marks, but not limited herein. The electronic devices may include display devices, antenna devices, touch displays, curved displays or free shape displays, but not limited herein. In addition, the electronic devices may be bendable or flexible display devices.

The electronic devices may, for example, include package device, display device, light-emitting diodes, liquid crystals, fluorescence, phosphors, other suitable display media or combinations of above, but not limited herein. The light-emitting diodes may, for example, include organic light-emitting diodes (OLEDs), inorganic light-emitting diodes (LEDs), mini-light-emitting diodes (mini LEDs, millimeter sized LEDs), micro-light-emitting diodes (micro-LEDs, micrometer sized LEDs), quantum dots (QDs) light-emitting diodes (e.g. QLEDs or QDLEDs), other suitable light-emitting diodes or any arrangement and combinations of the above, but not limited herein. In some embodiments, the display devices may, for example, include tiled display devices, but not limited herein.

The antenna devices may be, for example, liquid crystal antennas or other types of antennas, but not limited herein. The antenna devices may, for example, include tiled antenna devices, but not limited herein. It should be noted that, the electronic device may also be any arrangement and combinations of the devices describe above, but not limited herein. In addition, the appearance of the electronic device may be rectangular, circular, polygonal, a shape with curved edges or other suitable shapes. The electronic device may have peripheral systems such as a driving system, a control system, a light source system, a shelf system, etc. to support a display device, an antenna device or a tiled device.

Figure 2:
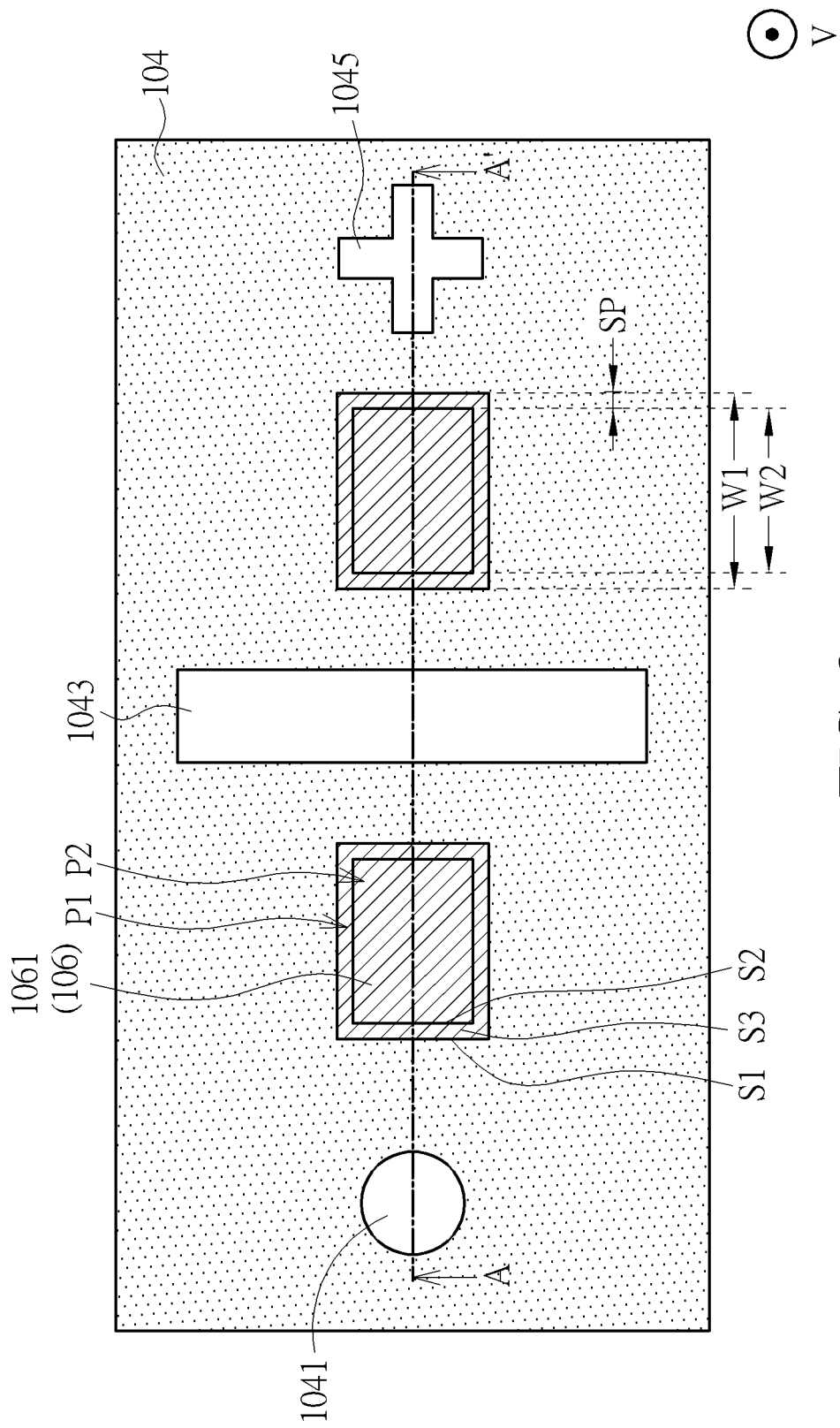
FIG. 2 is a top view schematic diagram of the metal structure of FIG. 1.

Please refer to FIG. 1 and FIG. 2. FIG. 1 is a cross-sectional view schematic diagram of a metal structure of an embodiment of the present disclosure. FIG. 2 is a top view schematic diagram of the metal structure of FIG. 1 in a direction V, wherein FIG. 1 is a cross-sectional structure corresponding to the cross-section line A-A' of FIG. 2. In some embodiments, the metal structure 10 may include a substrate 100, a release layer 102, a patterned seed layer 104 and a patterned metal layer 106, but not limited herein. The patterned seed layer 104 may be disposed on the substrate 100, and the release layer 102 may be disposed between the patterned seed layer 104 and the substrate 100. In addition, the patterned metal layer 106 may be disposed on the patterned seed layer 104.

The material of the substrate 100 may include glass, quartz, sapphire, polymers (e.g., polyimide (PI), polyethylene terephthalate (PET)) and/or other suitable materials, to serve as a flexible substrate or a rigid substrate, but not limited herein. In some embodiments, the substrate 100 may be used as a carrier substrate for forming the patterned seed layer 104 and the patterned metal layer 106. In addition, in some embodiments, after the patterned metal layer 106 is formed, the patterned seed layer 104 and the patterned metal layer 106 may be separated from the substrate 100 through the release layer 102. The material of the release layer 102 may include parylene, organic silicone resin or silicone oil, but not limited herein.

In some embodiments (as shown in FIG. 1 and FIG. 2), the patterned seed layer 104 may include an opening 1041, an opening 1043 and an opening 1045, but not limited herein. For example, the opening 1041, the opening 1043 and the opening 1045 may serve as alignment marks, and the alignment marks in patterned seed layer 104 may be used to align with alignment marks and/or corresponding positions in other layers or elements, so as to reduce positional deviation between different elements. The opening 1041, the opening 1043 and the opening 1045 may have identical or different patterns. For example (as shown in FIG. 2), the opening 1041 may have a circular pattern, the opening 1043 may have a rectangular pattern, and the opening 1045 may have a cross pattern, but not limited herein. In addition, as shown in FIG. 1, the thickness Ta of the patterned seed layer 104 may be about 0.2 micrometers (μm), but not limited herein. In addition, the material of the patterned seed layer 104 may include silver, copper, aluminum, molybdenum, tungsten, gold, chromium, nickel, platinum, titanium, iridium, rhodium, indium, bismuth, alloys of the above, combinations of the above or other metal materials with good electrical conductivity, but not limited herein.

The patterned metal layer 106 may include a metal member 1061 or a plurality of metal members 1061, the metal members 1061 may serve as conductive lines, circuits or other metal elements in the electronic device, but not limited herein. The metal member 1061 may include a first part P1 and a second part P2. The first part P1 may be disposed between the patterned seed layer 104 and the second part P2, and the width W1 of the first part P1 may be greater than the width W2 of the second part P2. In addition, the metal member 1061 may include an uneven side surface or a side surface with a step-like shape. For example, the first part P1 of the metal member 1061 may include a first side surface S1, and the second part P2 of the metal member 1061 may include a second side surface S2, wherein the first side surface S1 and the second side surface S2 are located on the same side. The metal member 1061 may further include a surface S3. The first side surface S1 and the second side surface S2 may be connected by the surface S3, and the surface S3 is not parallel to the first side surface S1 and the second side surface S2. In addition, a gap SP may exist between the first side surface S1 and the second side surface S2, wherein a ratio of the gap SP to the thickness Ta of the patterned seed layer 104 may be greater than or equal to 1.1 and less than or equal to 3 ($1.1 \leq SP/Ta \leq 3$). In addition, the material of the patterned metal layer 106 may include silver, copper, aluminum, molybdenum, tungsten, gold, chromium, nickel, platinum, titanium, iridium, rhodium, indium, bismuth, alloys of the above, combinations of the above or other metal materials with good conductivity, but not limited herein.

For example, in some embodiments, when the metal structure 10 serves as conductive lines in the redistribution layer (RDL), an insulating layer (e.g., the insulating layer 114 in FIG. 8 or FIG. 11) may be formed on the substrate 100 to cover the metal member 1061 (or the patterned metal layer 106). In this condition, since the metal member 1061 of this embodiment includes the side surface having the step, the adhesion between the metal member 1061 and the insulating layer may be improved, thereby improving the reliability of the electronic device.

In addition, as shown in FIG. 1, the patterned seed layer 104 may further include a metal pattern 104P or a plurality of metal patterns 104P. The metal pattern 104P may be disposed between the first part P1 of the metal member 1061 and the release layer 102, and the width W3 of the metal pattern 104P may be greater than the width W1 of the first part P1 of the metal member 1061.

Figure 3:
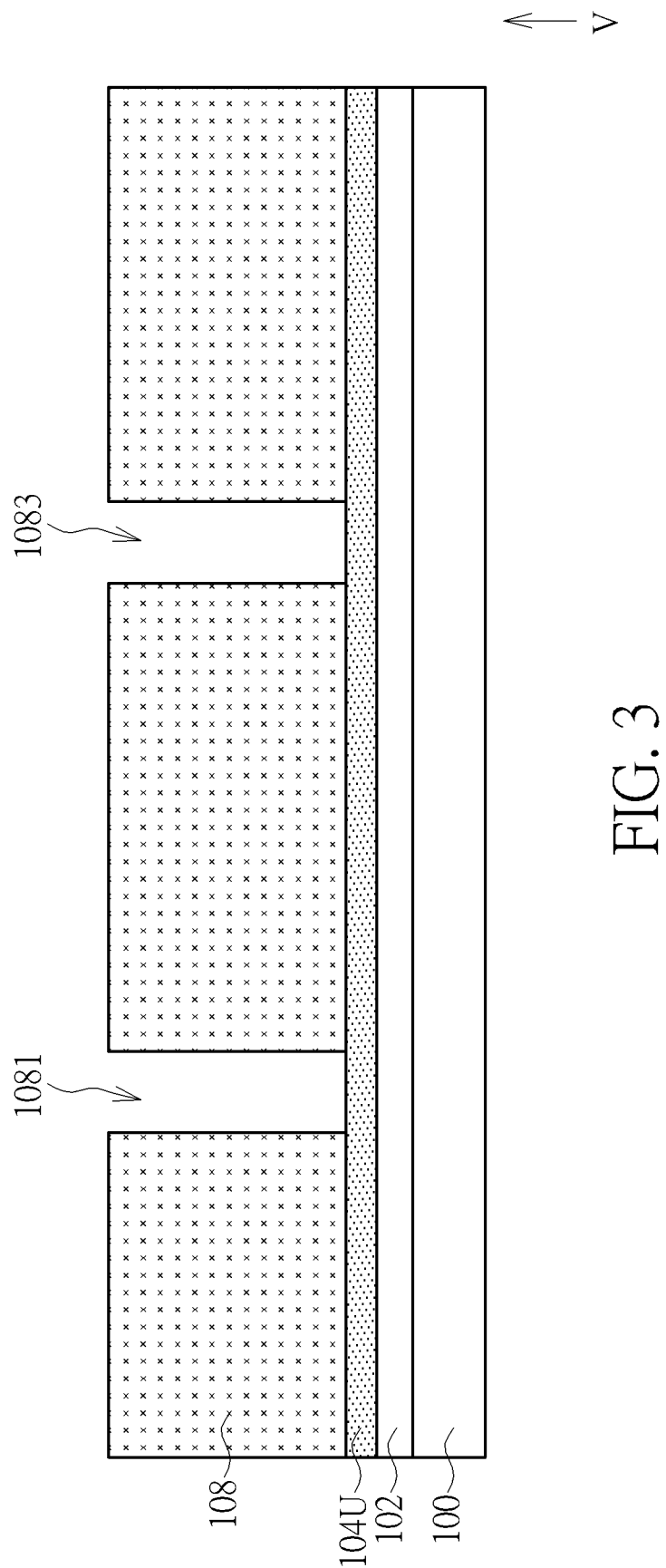
FIG. 3 to FIG. 6 are schematic diagrams of a manufacturing method of a metal structure of some embodiments of the present disclosure.

The manufacturing method of the metal structure 10 of this embodiment will be described below. Please refer to FIG. 3 to FIG. 6, which are schematic diagrams of a manufacturing method of a metal structure of some embodiments of the present disclosure. As shown in FIG. 3, a substrate 100 is provided, and a release layer 102, a seed layer 104U and a patterned photoresist layer 108 are sequentially formed on the substrate 100. First, a release layer 102 is formed on the substrate 100. For example, the release layer 102 may be coated entirely on the surface of the substrate 100, but not limited herein.

Next, a seed layer 104U is formed on the substrate 100. As shown in FIG. 3, the seed layer 104U may be formed on the release layer 102 to make the release layer 102 be disposed between the substrate 100 and the seed layer 104U. For example, the seed layer 104U may be formed entirely on the release layer 102 by a sputter process, but not limited herein. In this embodiment, the thickness of the seed layer 104U may be about 0.2 μm, but not limited herein. In addition, the material of the seed layer 104U may be the same as the material of the patterned seed layer 104, and will not be described redundantly herein.

Figure 4:
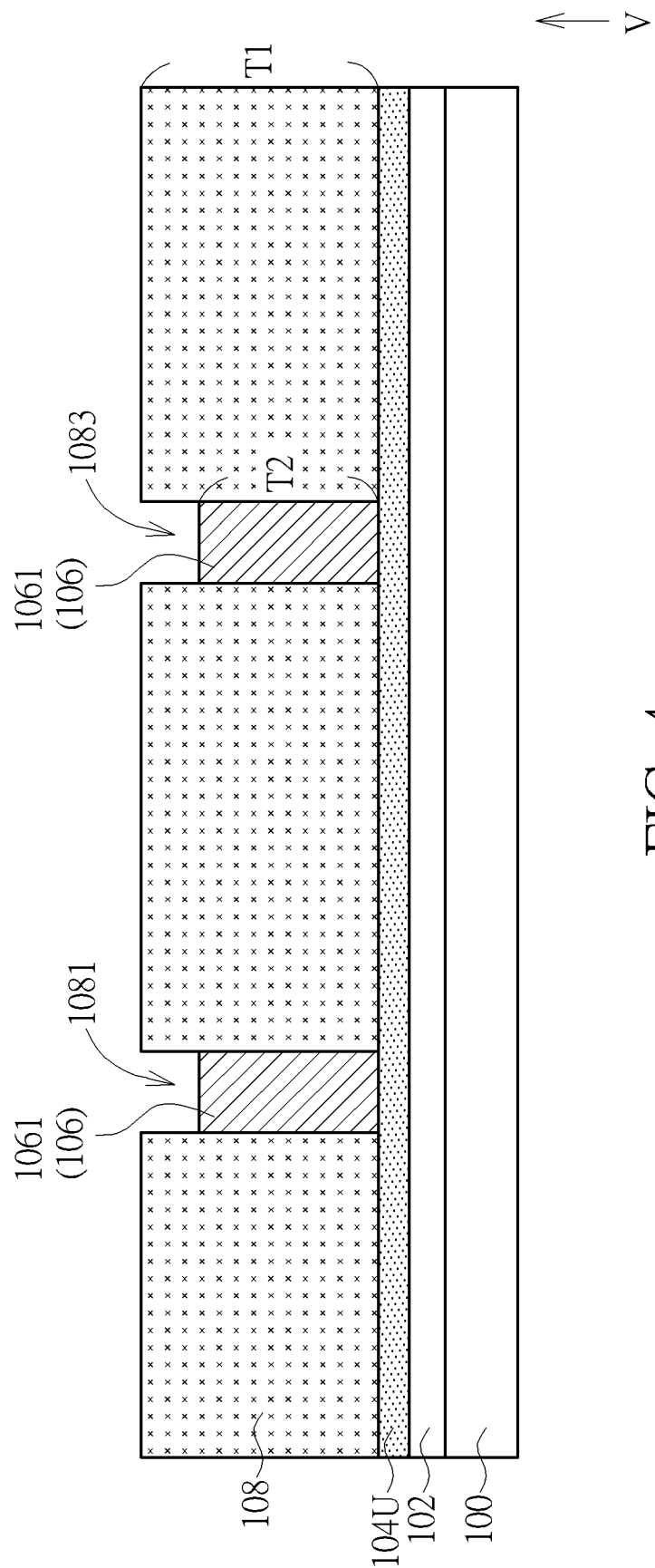

Then, as shown in FIG. 3 and FIG. 4, a patterned metal layer 106 is formed on the seed layer 106, which may include following steps. As shown in FIG. 3, a patterned photoresist layer 108 (or referred to as a second patterned photoresist layer) is formed on the seed layer 104U, and the patterned photoresist layer 108 may include a trench or a plurality of trenches, such as a trench 1081 and a trench 1083. For example, the forming method of the patterned photoresist layer 108 may include following steps. First, a photoresist layer is entirely formed on the seed layer 104U. Then, the photoresist layer is exposed through a mask, and after a development process, the trench 1081 and the trench 1083 are formed in the photoresist layer to obtain the patterned photoresist layer 108.

After the patterned photoresist layer 108 is formed, as shown in FIG. 4, a patterned metal layer 106 is formed in the trench 1081 and the trench 1083 of the patterned photoresist layer 108. For example, the patterned metal layer 106 may be formed in the trench 1081 and the trench 1083 of the patterned photoresist layer 108 by the electroplating or chemical plating process, but not limited herein. Furthermore, as shown in FIG. 4, the patterned metal layer 106 may include a plurality of metal members 1061 respectively disposed in the trench 1081 and the trench 1083, wherein the thickness T1 of the patterned photoresist layer 108 may be greater than the thickness T2 of the patterned metal layer 106 (or the metal member 1061). In addition, the patterned photoresist layer 108 in FIG. 4 may be removed after the patterned metal layer 106 is formed.

Figure 5:
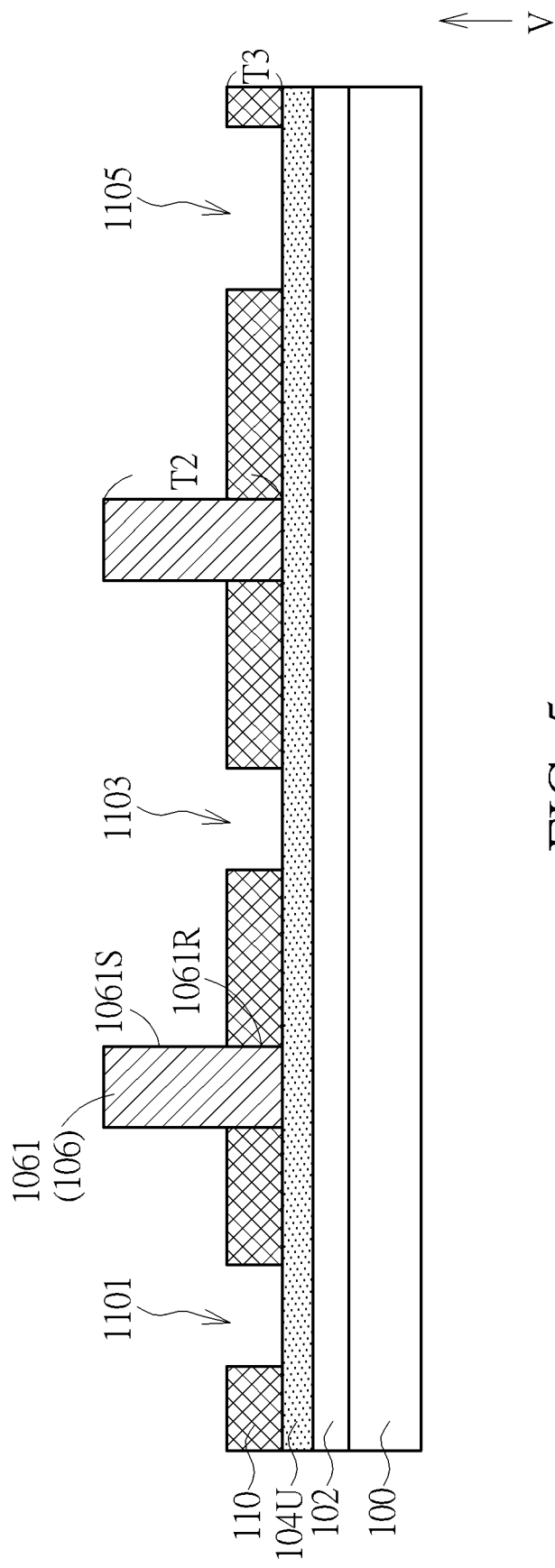

Then, as shown in FIG. 5, a patterned photoresist layer 110 (or referred to as a first patterned photoresist layer) is formed on the seed layer 104U, and the patterned photoresist layer 110 may include an opening or a plurality of openings, such as an opening 1101, an opening 1103 and an opening 1105. For example, the forming method of the patterned photoresist layer 110 may include following steps. First, a photoresist layer is entirely formed on the seed layer 104U. Then, the photoresist layer is exposed through a mask, and after a development process, the opening 1101, the opening 1103 and the opening 1105 are formed in the photoresist layer to obtain the patterned photoresist layer 110.

As shown in FIG. 5, the thickness T3 of the patterned photoresist layer 110 may be less than the thickness T2 of the patterned metal layer 106 (or the metal member 1061) and the thickness T1 of the patterned photoresist layer 108 by controlling the amount of the photoresist material of the patterned photoresist layer 110. In other words, the thickness T3 of the patterned photoresist layer 110 in FIG. 5 may be less than the thickness T1 of the patterned photoresist layer 108 in FIG. 4. As shown in FIG. 5, the patterned photoresist layer 110 may contact a portion 1061R of a side surface of the metal member 1061, and another portion 1061S of the side surface and a top surface of the metal member 1061 may be exposed. For example, the thickness T3 of the patterned photoresist layer 110 may be greater than or equal to 1 μm and less than or equal to 2 μm (1 μm≤T3≤2 μm), and the thickness T1 of the patterned photoresist layer 108 in FIG. 4 may be greater than or equal to 2.1 μm and less than or equal to 5 μm (2.1 μm≤T1≤5 μm), but not limited herein. In the present disclosure, using a photoresist layer with thinner thickness to manufacture the patterned photoresist layer 110 may save materials, shorten exposure time and reduce energy of exposure light, thereby reducing the manufacturing cost and improving efficiency.

In addition, similar to the opening 1041, the opening 1043 and the opening 1045 in FIG. 2, the opening 1101, the opening 1103 and the opening 1105 in the patterned photoresist layer 110 may also have identical or different patterns in the top view. For example, similar to FIG. 2, the opening 1101 may have a circular pattern, the opening 1103 may have a rectangular pattern, and the opening 1105 may have a cross pattern, but not limited herein.

Figure 6:
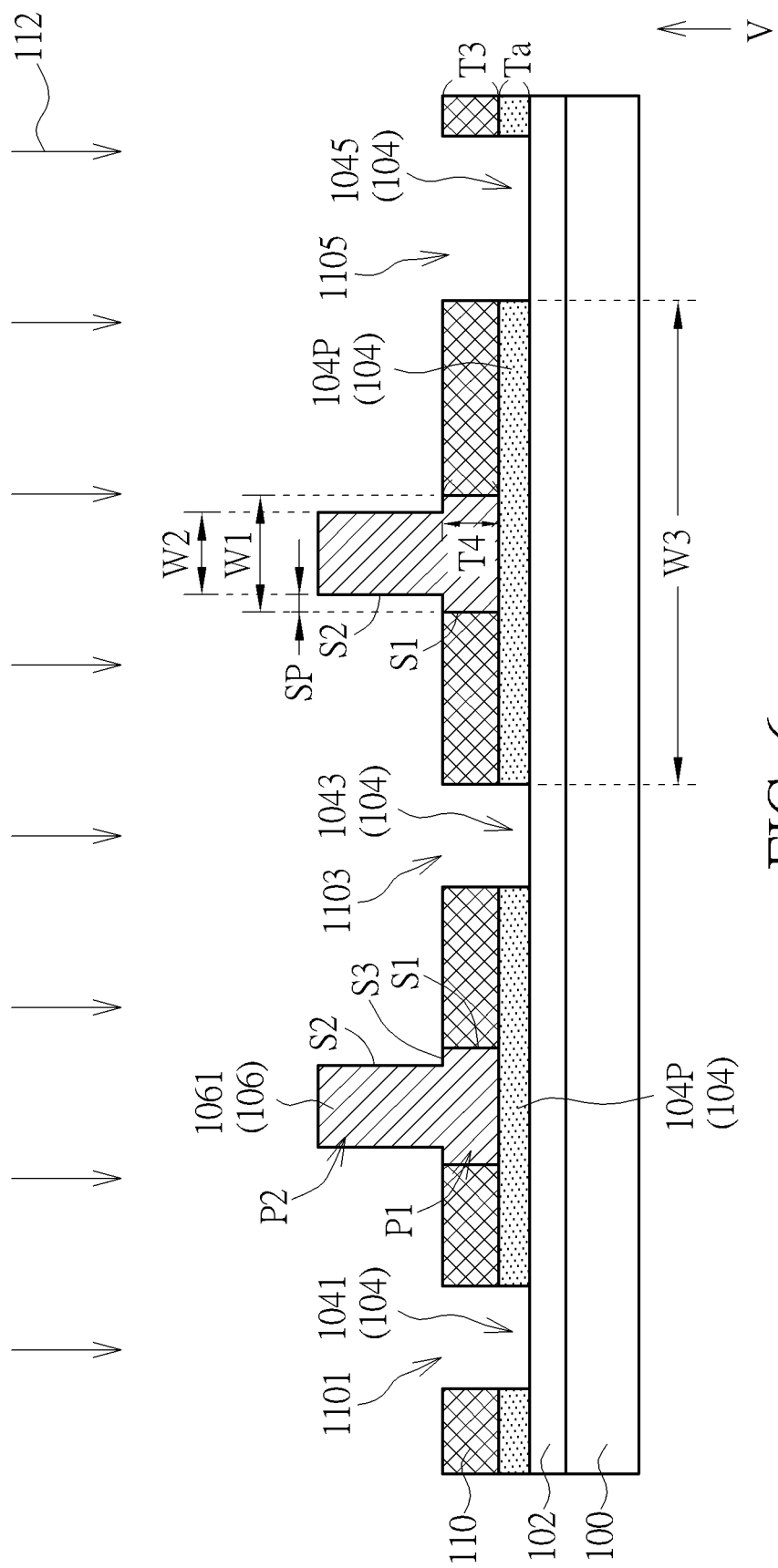

Then, as shown in FIG. 6, performing a patterning process 112 (or referred to as a first patterning process) to the seed layer 104U of FIG. 5 through the patterned photoresist layer 110 to form a patterned seed layer 104, wherein the patterning process 112 may include the etching process, but not limited herein. The features of the patterned seed layer 104 have been described in FIG. 1, FIG. 2 and related paragraphs, and will not be described redundantly herein. As shown in FIG. 5, since the top surface and the portion 1061S of the side surface of the metal member 1061 may be exposed, when the patterning process 112 of FIG. 6 is performed, the top surface and the portion 1061S of the side surface of the metal member 1061 in FIG. 5 may be etched, and the portion 1061R of the side surface of the metal member 1061 covered by the patterned photoresist layer 110 may not be etched. Thus, the metal member 1061 may include a first part P1 and a second part P2 after the patterning process 112 (as shown in FIG. 6), and the first part P1 may be disposed between the patterned seed layer 104 and the second part P2. The width W1 of the first part P1 is greater than the width W2 of the second part P2, and the thickness T4 of the first part P1 may be substantially the same as the thickness T3 of the patterned photoresist layer 110.

Therefore, after the patterning process 112, the metal member 1061 may include a side surface having a step-like shape. For example, the first part P1 of the metal member 1061 may include a first side surface S1, and the second part P2 of the metal member 1061 may include a second side surface S2. Furthermore, the metal member 1061 may further include a surface S3, and the first side surface S1 and the second side surface S2 may be connected by the surface S3. The first side surface S1 and the second side surface S2 are disposed on the same side, and the surface S3 is not parallel to the first side surface S1 and the second side surface S2. In addition, a ratio of the gap SP between the first side surface S1 and the second side surface S2 to the thickness Ta of the patterned seed layer 104 may be greater than or equal to 1.1 and less than or equal to 3 (1.1≤SP/Ta≤3). In addition, the width W3 of the metal pattern 104P of the patterned seed layer 104 may be greater than the width W1 of the first part P1 of and the width W2 of the second part P2 of the metal member 106l.

Figure 7:
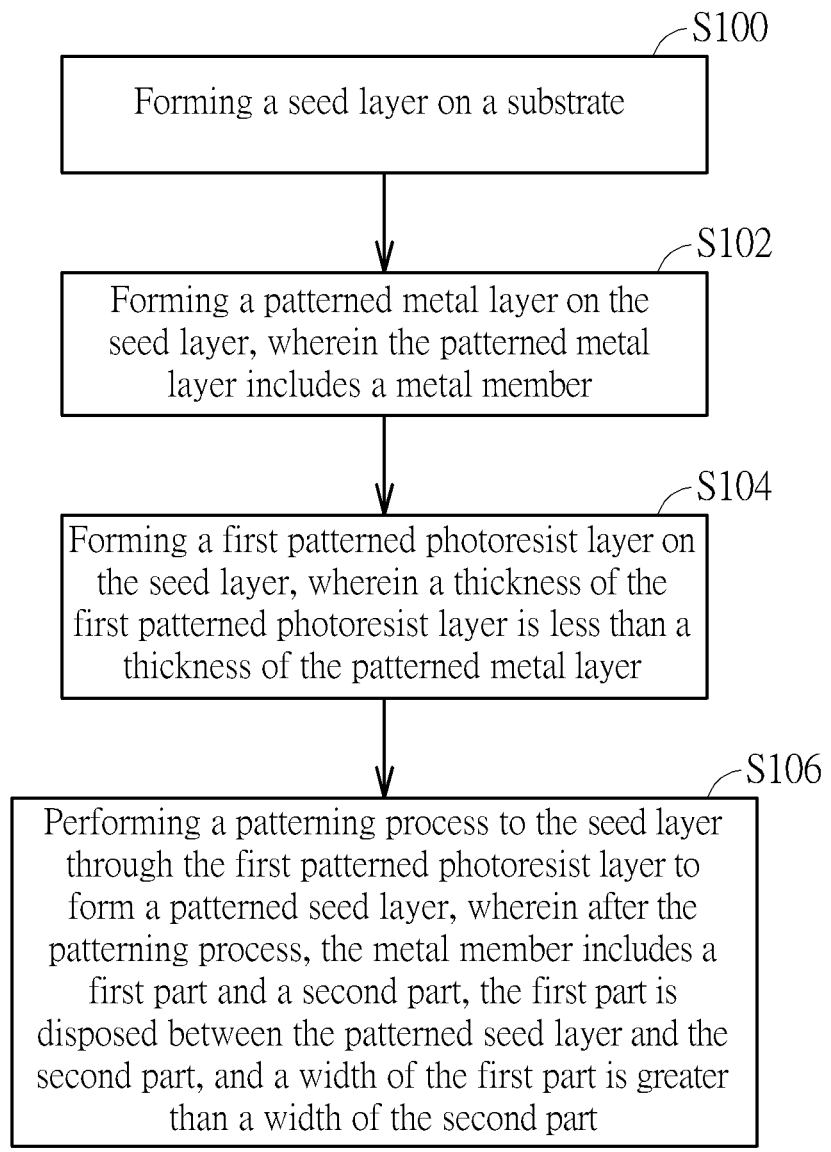
FIG. 7 is a flow chart of a manufacturing method of the metal structure of FIG. 1.

Then, the patterned photoresist layer 110 may be removed after the patterning process 112 to obtain the metal structure 10 in FIG. 1 and FIG. 2. Please refer to FIG. 7, which is a flow chart of a manufacturing method of the metal structure 10 of FIG. 1 according to the above steps. The manufacturing method of the metal structure 10 of the present disclosure may mainly include (but not limited to) the steps shown in FIG. 7:

Step S100: forming a seed layer 104U on a substrate 100;

Step S102: forming a patterned metal layer 106 on the seed layer 104U, wherein the patterned metal layer 106 includes a metal member 106l;

Step S104: forming a first patterned photoresist layer 110 on the seed layer 104U, wherein a thickness T3 of the first patterned photoresist layer 110 is less than a thickness T2 of the patterned metal layer 106; and Step S106: performing a patterning process to the seed layer 104U through the first patterned photoresist layer 110 to form a patterned seed layer 104, wherein after the patterning process, the metal member 106l includes a first part P1 and a second part P2, the first part P1 is disposed between the patterned seed layer 104 and the second part P2, and a width W1 of the first part P1 is greater than a width W2 of the second part P2.

It should be understood that the manufacturing method of the metal structure 10 may not be limited to the steps described above, and other steps may be performed before, after or between any of the steps that are shown. In addition, some steps may be performed in different sequence. After forming the metal structure 10 in FIG. 1 and FIG. 2, the manufacturing method of the metal structure of this embodiment may further include following steps.

Figure 8:
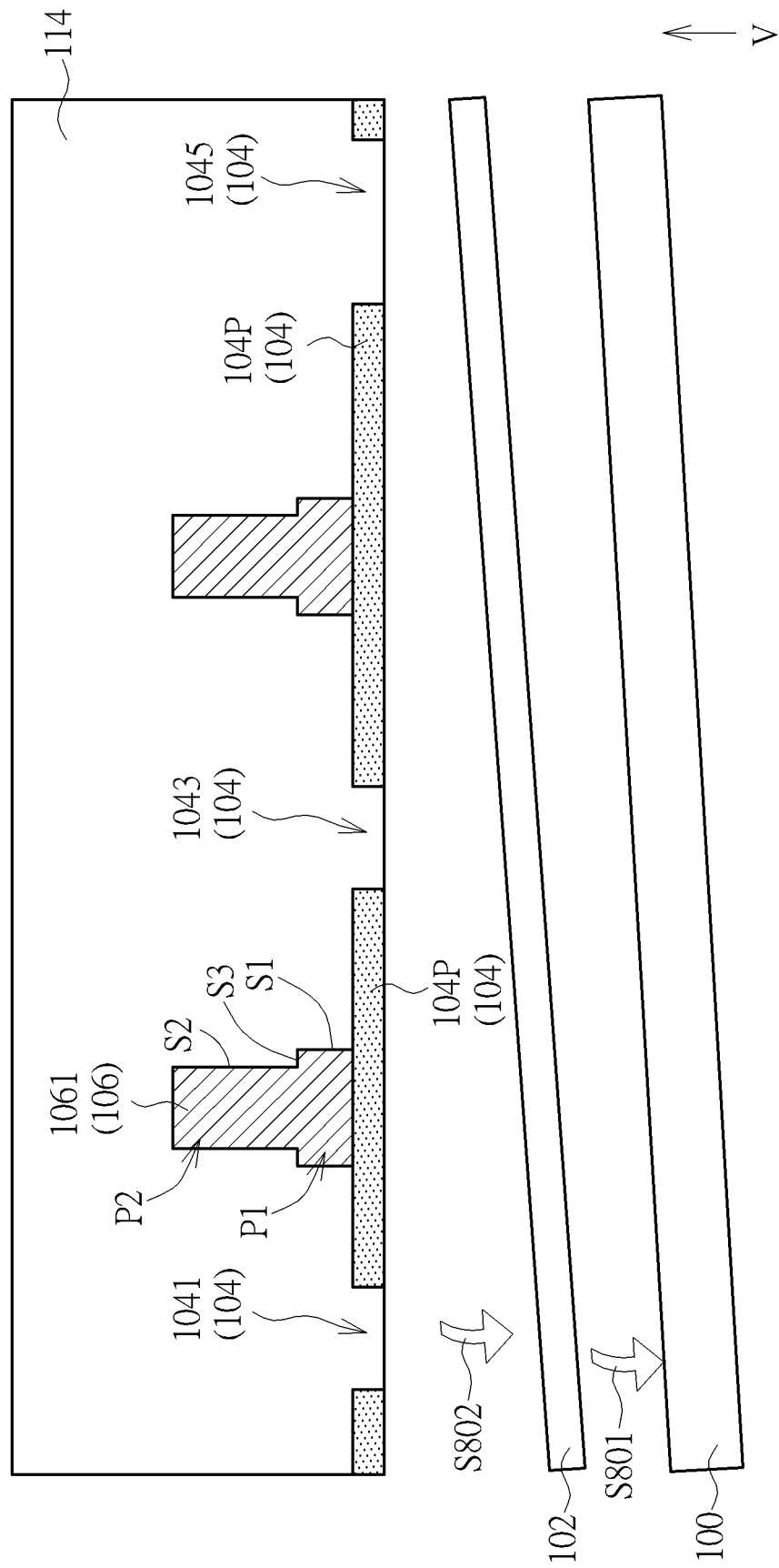
FIG. 8 to FIG. 9 are schematic diagrams of steps performed after forming the metal structure of FIG. 1.
Figure 9:
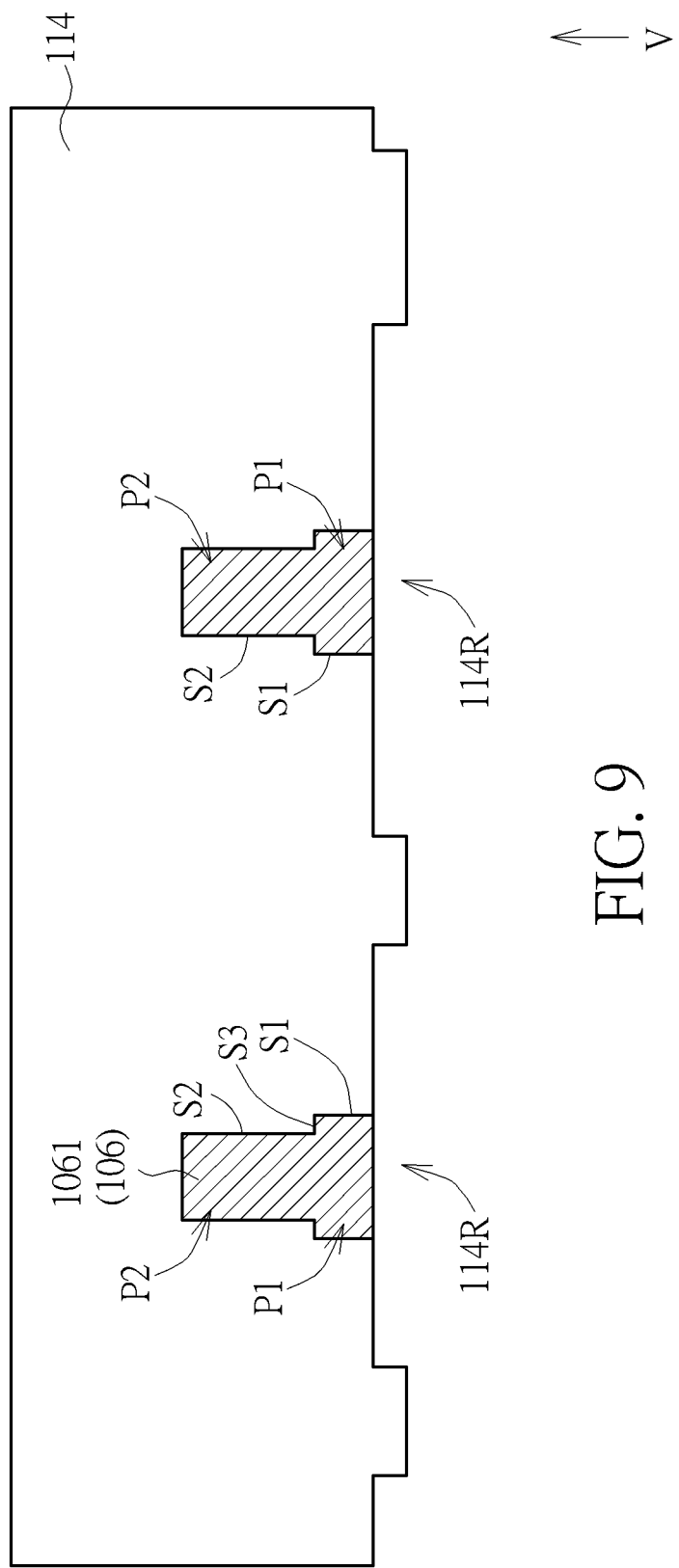

After forming the metal structure 10 in FIG. 1 and FIG. 2, the steps in FIG. 8 and FIG. 9 may be continued to perform. Firstly, please refer to FIG. 8 and FIG. 1 simultaneously, an insulating layer 114 (shown in FIG. 8) is formed on the substrate 100 in FIG. 1, and the insulating layer 114 may cover the patterned metal layer 106 (e.g., the metal members 106l) and the patterned seed layer 104 (e.g., the metal patterns 104P). In other words, the patterned metal layer 106 and the patterned seed layer 104 may be disposed between the release layer 102 and the insulating layer 114. The structure of the insulating layer 114 may be a single layer structure or a multilayer structure, but not limited herein. The material of the insulating layer 114 may include organic insulating materials, inorganic insulating materials or combinations of the above, but not limited herein. In addition, since the metal member 106l of this embodiment includes a side surface with the step-like shape, the adhesion between the metal member 106l and the insulating layer 114 may be improved.

After the insulating layer 114 is formed, a step of removing the substrate 100 and the release layer 102 is performed. The removing step may simultaneously remove the substrate 100 and the release layer 102, or may separately remove the substrate 100 and the release layer 102. Taking the method of separately removing as an example, the substrate 100 may be removed from the surface of the release layer 102, as shown in the step S801 in FIG. 8. After the substrate 100 is removed, the release layer 102 may be removed from the surface of the insulating layer 114 (and/or the patterned seed layer 104), as shown in the step S802 in FIG. 8. In some embodiments (as shown in FIG. 9), the step of removing the patterned seed layer 104 may be performed to obtain a structure including the patterned metal layer 106 and the insulating layer 114. The method of removing the patterned seed layer 104 may include the etching process, but not limited herein. In addition, a plurality of trenches 114R may be formed in the insulating layer 114 after the patterned seed layer 104 is removed, and the positions of the trenches 114R may correspond to the positions of the patterned seed layer 104 in FIG. 8.

In some embodiments, a step of forming a second patterned metal layer (not shown) and a second patterned insulating layer (not shown) may also be performed after the insulating layer 114 is formed. Depending on product requirements, a step of forming a third patterned metal layer (not shown) and a third patterned insulating layer (not shown) and so on may further be performed, thereby increasing the number of the patterned metal layers and the number of insulating layers appropriately. The step of removing the substrate 100 and the release layer 102 described above may be performed after the required numbers of the patterned metal layers and the insulating layers are obtained. The manufacturing method of the metal structure of the present disclosure is not limited to the above embodiments. Some embodiments of the present disclosure will be disclosed in the following. However, in order to simplify the illustration and clearly show the differences between various embodiments, the same elements in the following would be labeled with the same symbol, and repeated features will not be described redundantly.

Figure 10:
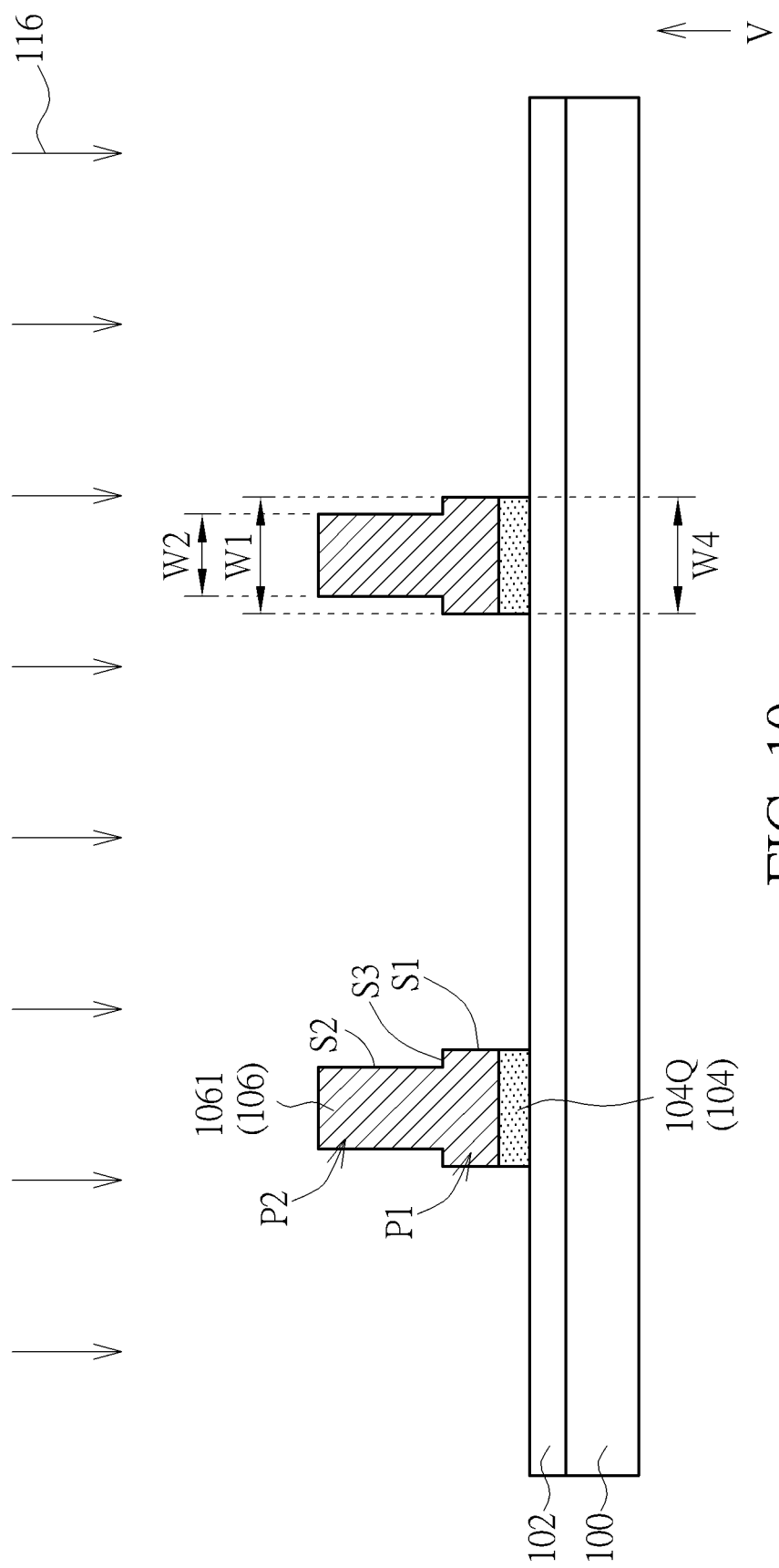
FIG. 10 to FIG. 12 are schematic diagrams of a manufacturing method of a metal structure of some embodiments of the present disclosure.
Figure 11:
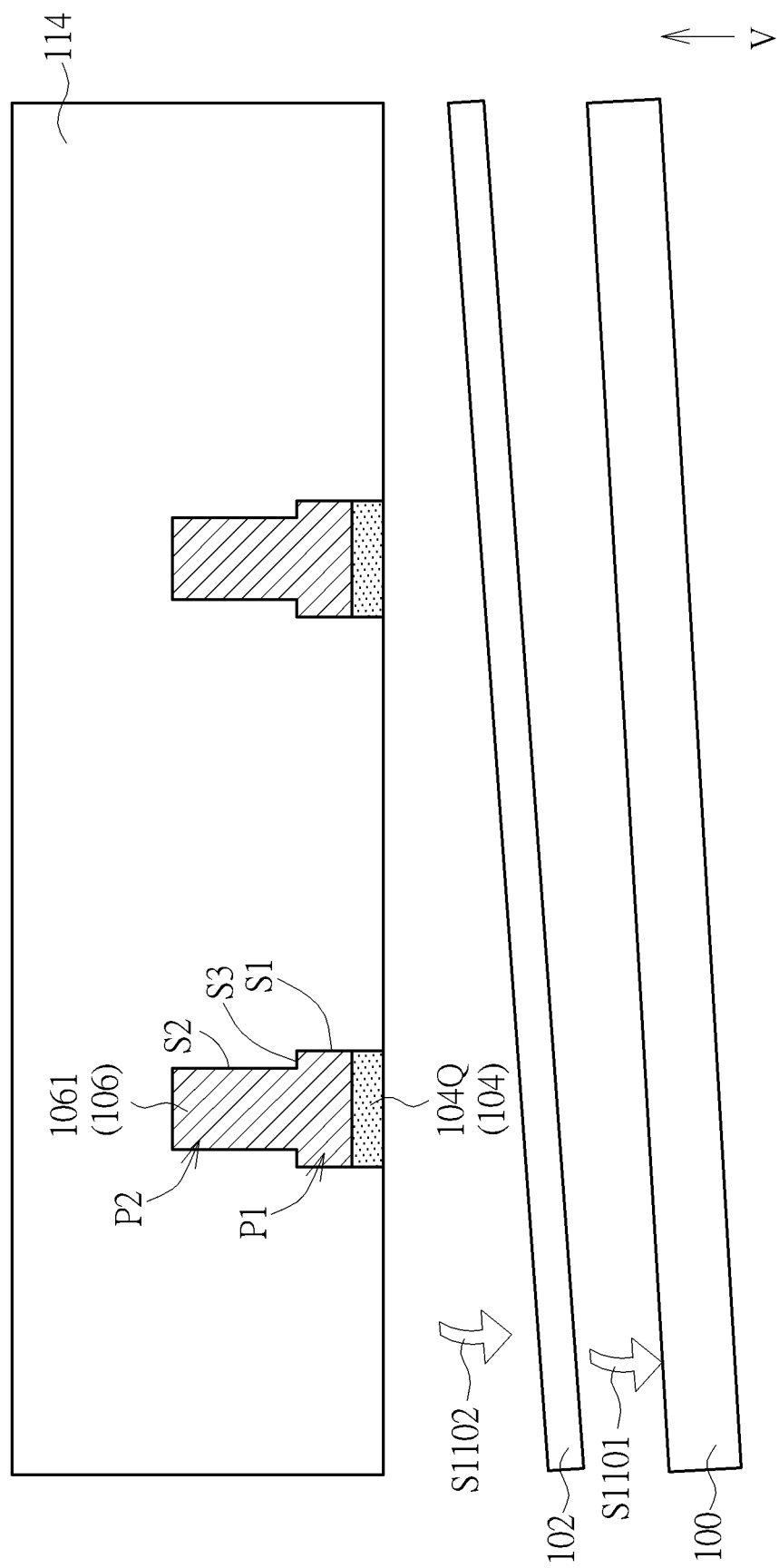
Figure 12:
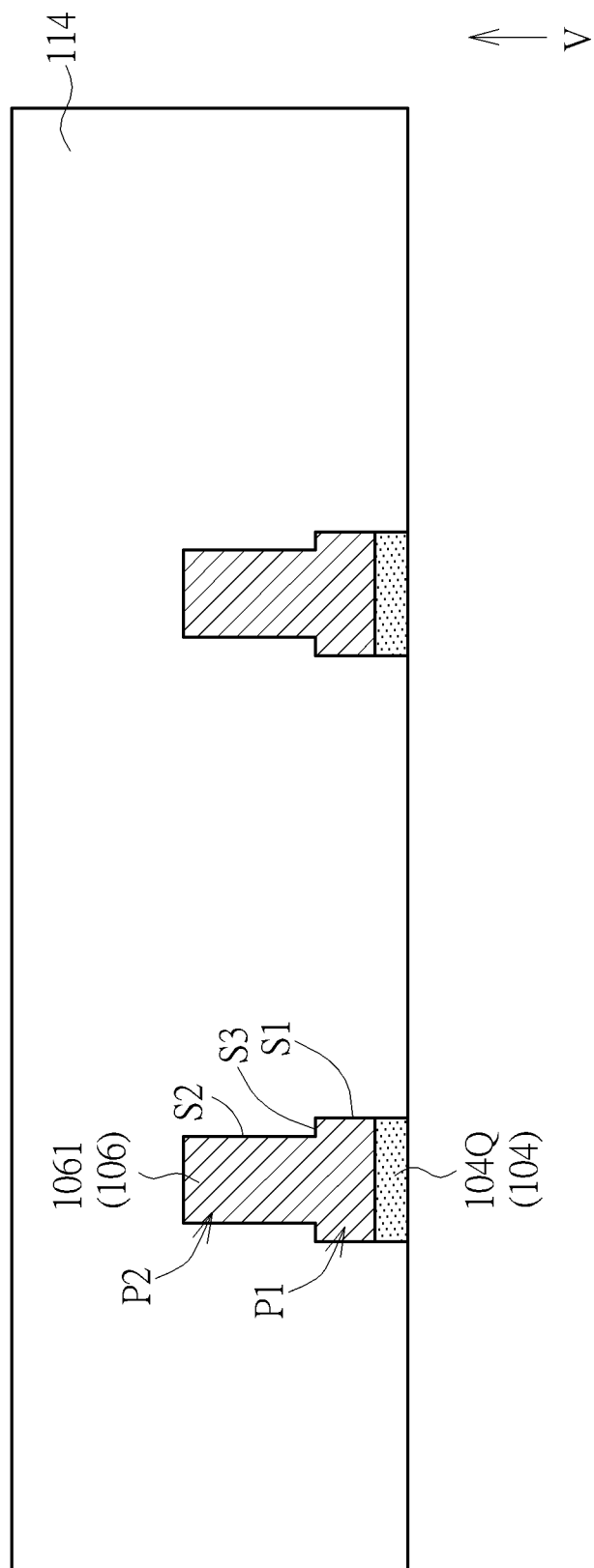

Please refer to FIG. 10 to FIG. 12, which are schematic diagrams of a manufacturing method of a metal structure of some embodiments of the present disclosure. In this embodiment, the structure of FIG. 1 may be obtained by the steps in FIG. 3 to FIG. 6 in the previous embodiment, and then the steps in FIG. 10 to FIG. 12 are performed. As shown in FIG. 10, after the metal structure 10 in FIG. 1 is finished, a patterning process 116 (shown in FIG. 10) may be performed to the patterned seed layer 104 in FIG. 1 to remove a portion of the patterned seed layer 104 that is not covered by the patterned metal layer 106 (or the metal member 106l). For example, the patterning process 116 (or referred to as a second patterning process) may include the etching process, but not limited herein. The patterned seed layer 104 may include metal patterns 104Q after the patterning process 116 is performed, and the width W4 of the metal pattern 104Q may be substantially the same as the width W1 of the first part P1 of the metal member 106l.

Then, please refer to FIG. 10 and FIG. 11 simultaneously. An insulating layer 114 (shown in FIG. 11) is formed on the substrate 100 in FIG. 10, and the insulating layer 114 may cover patterned metal layer 106 (e.g., the metal members 106l) and the patterned seed layer 104 (e.g., the metal patterns 104Q). In other words, the patterned metal layer 106 and the patterned seed layer 104 may be disposed between the release layer 102 and the insulating layer 114.

The step of removing the substrate 100 and the release layer 102 is performed after the insulating layer 114 is formed. The removing step may simultaneously remove the substrate 100 and the release layer 102, or may separately remove the substrate 100 and the release layer 102. Taking the method of separately removing as an example, the substrate 100 may be removed from the surface of the release layer 102, as shown in the step S1101 in FIG. 11. The release layer 102 may be removed from the surface of the insulating layer 114 (and/or the patterned seed layer 104) after the substrate 100 is removed, as shown in the step S1102 in FIG. 10. A structure including the patterned seed layer 104 (e.g., the metal patterns 104Q), the patterned metal layer 106 (e.g., the metal members 1061) and the insulating layer 114 may be obtained after the substrate 100 and the release layer 102 are removed, as shown in FIG. 12.

In some embodiments, a step of forming a second patterned metal layer (not shown) and a second patterned insulating layer (not shown) may also be performed after the insulating layer 114 is formed. Depending on product requirements, a step of forming a third patterned metal layer (not shown) and a third patterned insulating layer (not shown) and so on may further be performed, thereby increasing the number of the patterned metal layers and the number of insulating layers appropriately. The step of removing the substrate 100 and the release layer 102 described above may be performed after the required numbers of the patterned metal layers and the insulating layers are obtained.

Figure 13:
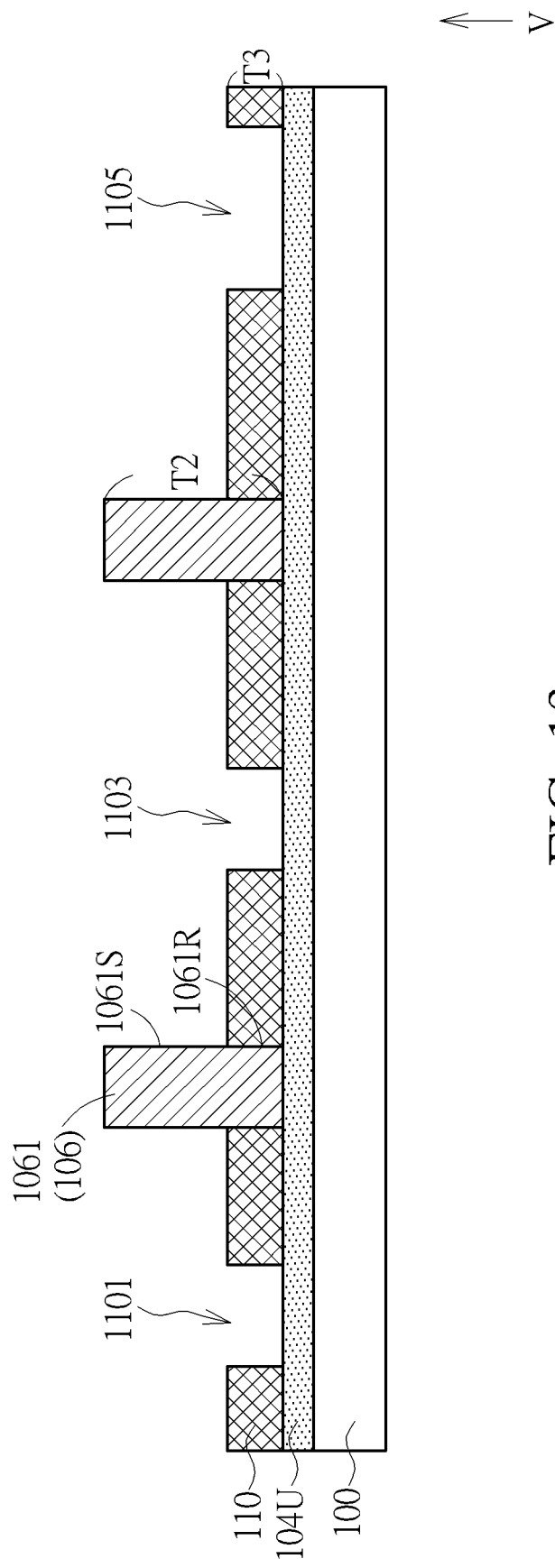
FIG. 13 to FIG. 15 are schematic diagrams of a manufacturing method of a metal structure of some embodiments of the present disclosure.
Figure 14:
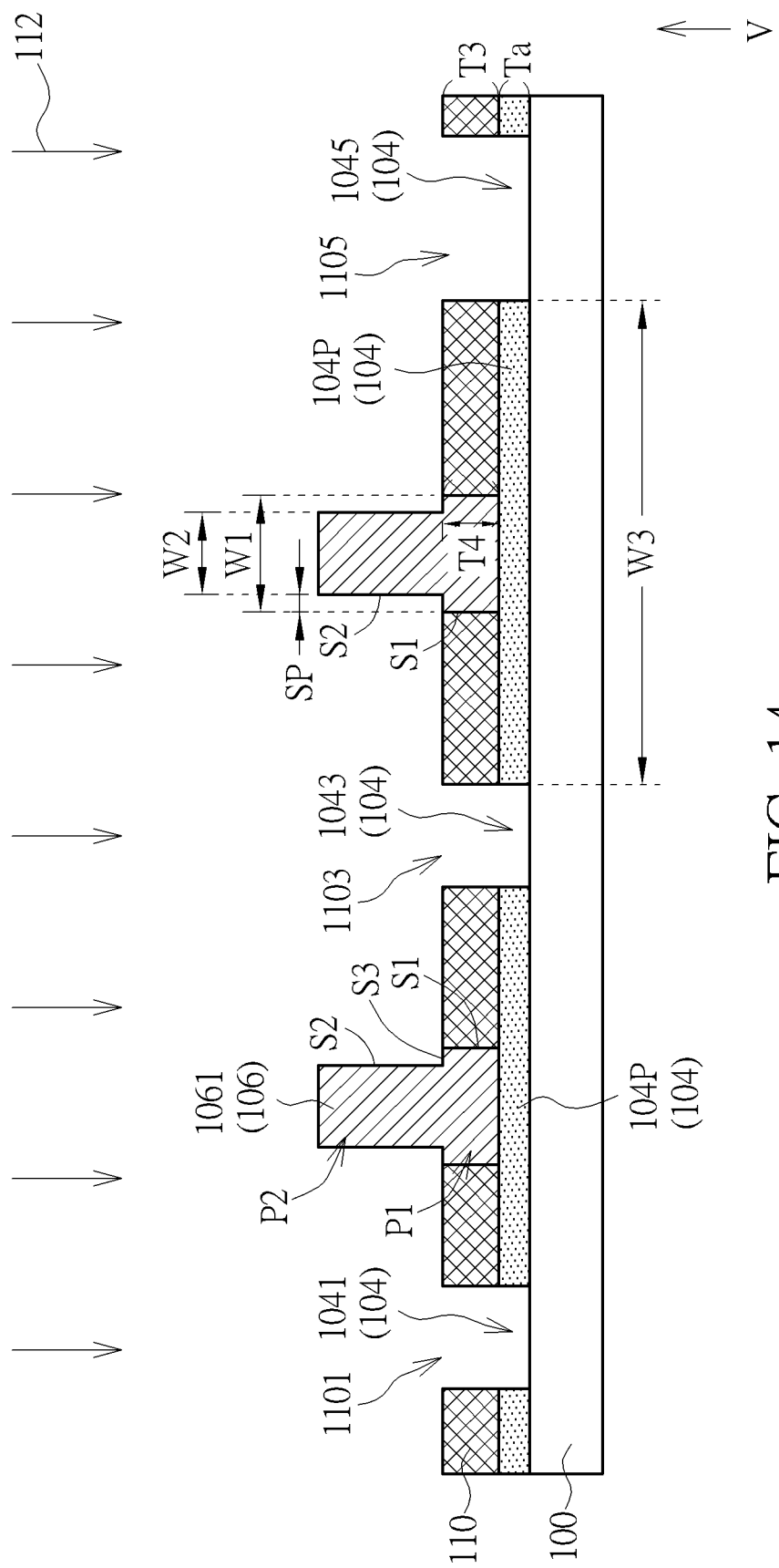
Figure 15:
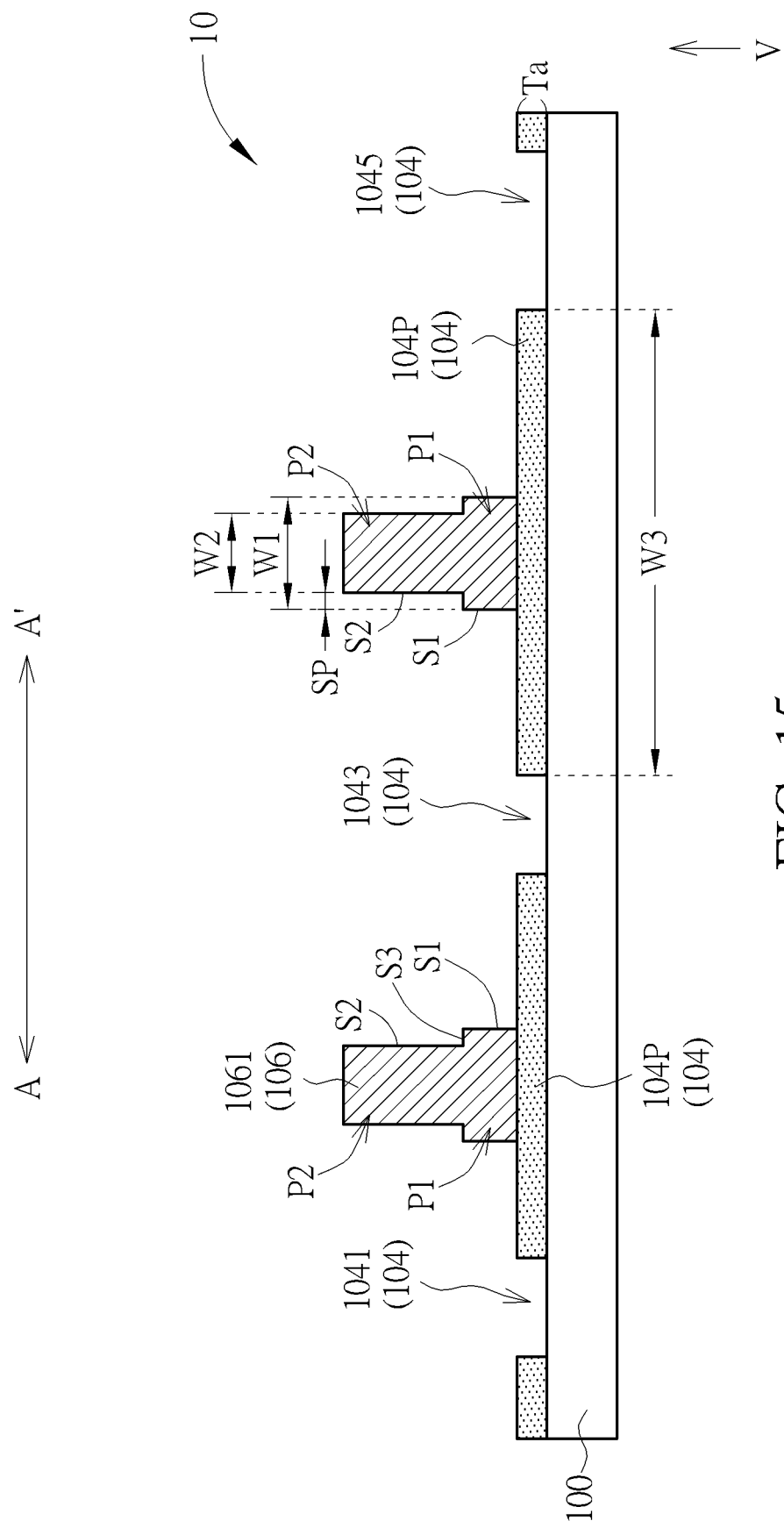

The metal structure and the manufacturing method thereof shown in FIG. 1 to FIG. 6 may be applied to, for example, the manufacturing process of package devices. For example, the metal structure and the manufacturing method thereof shown in FIG. 1 to FIG. 6 may be applied to the redistribution layer (RDL)-first structure and the manufacturing method thereof, but this disclosure is not limited herein. Please refer to FIG. 13 to FIG. 15, FIG. 13 to FIG. 15 are schematic diagrams of a manufacturing method of a metal structure of some embodiments of the present disclosure. The metal structure and the manufacturing method thereof in FIG. 13 to FIG. 15 may for example be applied to the chip-first structure and the manufacturing method thereof, but not limited herein. The chip-first structure and the manufacturing method thereof may include the chip face up process and structure and the chip face down process and structure, but not limited herein.

In the chip-first structure and the manufacturing method thereof, the substrate 100 in FIG. 13 to FIG. 15 may be at least a portion of a silicon wafer, a system on chip (SOC) or a printed circuit board (PCB), but not limited herein. For example, the substrate 100 may include a wafer or a packaged wafer, but not limited herein.

As shown in FIG. 13, the seed layer 104U may be formed on a surface of the substrate 100, and the patterned metal layer 106 and the patterned photoresist layer 110 may be sequentially formed on the seed layer 104U. For details of forming the seed layer 104U, the patterned metal layer 106 and the patterned photoresist layer 110, please refer to the related paragraphs of FIG. 3 to FIG. 5. In addition, the release layer 102 may not be included in the structures of FIG. 13 to FIG. 15, or the release layer 102 may not be formed on the side of the substrate 100 away from the seed layer 104U compared with the structures in FIG. 5, FIG. 6 and FIG. 1, but not limited herein. According to some embodiments, the substrate 100 may also be selectively disposed on a carrier substrate, and the release layer 102 may be disposed between the carrier substrate and the substrate 100.

Next, as shown in FIG. 14, the patterning process 112 may be performed on the seed layer 104U of FIG. 13 through the patterned photoresist layer 110 to form the patterned seed layer 104. For example, an opening 1041, an opening 1043 and an opening 1045 may expose portions of the surface of the substrate 100, but not limited herein. The opening 1041, the opening 1043 and the opening 1045 may be, for example, a portion of a cutting line, but not limited herein. For details of the patterning process 112 and the first part P1 and the second part P2 of the metal member 1061, please refer to the related paragraphs of FIG. 6. Next, the patterned photoresist layer 110 in FIG. 14 may be removed after the patterning process 112 to obtain the metal structure 10 in FIG. 15. In some embodiments, contacts may be disposed on the substrate 100 (such as the wafer), and the contacts may be electrically connected to the metal patterns 104P of the patterned seed layer 104, but not limited herein.

Although the release layer 102 may not be included or formed in the structures of FIG. 13 to FIG. 15, the release layer 102 may be formed between the substrate 100 and the seed layer 104U in the chip-first structure and the manufacturing method thereof in some embodiments, but not limited herein.

From the above description, in the manufacturing method of the metal structure of the present disclosure, the photoresist layer with reduced thickness is used in the step of patterning the seed layer, this method may save materials, shorten exposure time and reduce energy of exposure light, thereby reducing the manufacturing cost and improving efficiency. In addition, in the metal structure manufactured by the manufacturing method of the present disclosure, the metal member includes a side surface with a step-like shape, so that the adhesion between the metal member and the insulating layer may be improved, and thus the reliability of the electronic device may be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A manufacturing method of a metal structure, comprising:

forming a seed layer on a substrate;

forming a patterned metal layer on the seed layer, wherein the patterned metal layer comprises a metal member;

forming a first patterned photoresist layer on the seed layer after the patterned metal layer is formed, wherein a thickness of the first patterned photoresist layer is less than a thickness of the patterned metal layer, the first patterned photoresist layer contacts a lower part of the metal member, and an upper part of the metal member is exposed from the first patterned photoresist layer; and performing a first patterning process to the seed layer through the first patterned photoresist layer to form a patterned seed layer, wherein a portion of the upper part of the metal member is removed during the first patterning process, wherein after the first patterning process, the lower part of the metal member is defined as a first part of the metal member, and a remaining portion of the upper part is defined as a second part of the metal member, the first part is disposed between the patterned seed layer and the second part, and a width of the first part is greater than a width of the second part, wherein the first part of the metal member comprises a fist side surface, the second part of the metal member comprises a second side surface, and a distance exists between the first side surface and the second side surface, wherein a ratio of the distance to a thickness of the seed layer is greater than or equal to 1.1 and less than or equal to 3.

2. The manufacturing method of the metal structure according to claim 1, wherein the first side surface and the second side surface are located on a same side of the metal member.

3. The manufacturing method of the metal structure according to claim 1, wherein a thickness of the first part of the metal member is the same as the thickness of the first patterned photoresist layer.

4. The manufacturing method of the metal structure according to claim 1, wherein the first patterned photoresist layer contacts a portion of a side surface of the metal member.

5. The manufacturing method of the metal structure according to claim 4, wherein another portion of the side surface of the metal member and a top surface of the metal member are exposed from the first patterned photoresist layer.

6. The manufacturing method of the metal structure according to claim 1, further comprising forming a release layer on the substrate, wherein the release layer is disposed between the substrate and the seed layer.

7. The manufacturing method of the metal structure according to claim 6, further comprising forming an insulating layer on the substrate, wherein the insulating layer covers the patterned metal layer and the patterned seed layer.

8. The manufacturing method of the metal structure according to claim 7, as further comprising removing the substrate and the release layer after forming the insulating layer.

9. The manufacturing method of the metal structure according to claim 8, further comprising removing the patterned seed layer after removing the substrate and the release layer.

10. The manufacturing method of the metal structure according to claim 1, wherein the thickness of the first patterned photoresist layer is greater than or equal to 1 μm and less than or equal to 2 μm.

11. The manufacturing method of the metal structure according to claim 1, wherein after the first patterning process, the patterned seed layer comprises a metal pattern, and a width of the metal pattern is greater than the width of the first part of the metal member.

12. The manufacturing method of the metal structure according to claim 1, further comprising performing a second patterning process to the patterned seed layer, wherein after the second patterning process, the patterned seed layer comprises a metal pattern, and a width of the metal pattern is substantially the same as the width of the first part of the metal member.

13. The manufacturing method of the metal structure according to claim 1, further comprising performing a second patterning process to the patterned seed layer, wherein after the second patterning process, a portion of the patterned seed layer that is not covered by the patterned metal layer is removed.

14. The manufacturing method of the metal structure according to claim 1, wherein the forming the patterned metal layer on the seed layer comprises:
 forming a second patterned photoresist layer on the seed layer, wherein the second patterned photoresist layer comprises a trench; and
 forming the metal member of the patterned metal layer in the trench of the second patterned photoresist layer.

15. The manufacturing method of the metal structure according to claim 14, wherein the thickness of the first patterned photoresist layer is less than a thickness of the second patterned photoresist layer.

16. The manufacturing method of the metal structure according to claim 14, wherein a thickness of the second patterned photoresist layer is greater than the thickness of the patterned metal layer.

17. The manufacturing method of the metal structure according to claim 14, wherein a thickness of the second patterned photoresist layer is greater than or equal to 2.1 μm and less than or equal to 5 μm.

18. The manufacturing method of the metal structure according to claim 1, wherein the first patterned photoresist layer comprises an opening or a plurality of openings.

19. The manufacturing method of the metal structure according to claim 18, wherein the plurality of openings have identical or different patterns in a top view.

* * * * *